(12) United States Patent
Won et al.

(10) Patent No.: US 7,576,575 B2
(45) Date of Patent: Aug. 18, 2009

(54) RESET SIGNAL GENERATOR IN SEMICONDUCTOR DEVICE

(75) Inventors: Myung-Gyoo Won, Hwaseong-si (KR); Kyu-Chan Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/511,850

(22) Filed: Aug. 29, 2006

(65) Prior Publication Data

US 2007/0152721 A1    Jul. 5, 2007

(30) Foreign Application Priority Data

Jan. 5, 2006    (KR) .................... 10-2006-0001287

(51) Int. Cl.
*H03L 7/00* (2006.01)
(52) U.S. Cl. .................... 327/143; 327/142; 327/198
(58) Field of Classification Search ............ 327/143, 327/144, 108, 112, 205, 206
See application file for complete search history.

(56) References Cited

U.S. PATENT DOCUMENTS

| 5,287,011 | A | 2/1994 | Koshikawa et al. ...... 307/272.3 |
| 6,285,222 | B1 | 9/2001 | Kitade .................... 327/143 |
| 6,882,570 | B2 | 4/2005 | Byeon et al. ........... 365/185.18 |
| 6,930,534 | B1 * | 8/2005 | Fu .............................. 327/427 |
| 2004/0239383 | A1 | 12/2004 | Kang |
| 2005/0073341 | A1 | 4/2005 | Lim |
| 2005/0093529 | A1 | 5/2005 | Hur |
| 2005/0141287 | A1 | 6/2005 | Do |

* cited by examiner

*Primary Examiner*—Kenneth B Wells
*Assistant Examiner*—Daniel Rojas
(74) *Attorney, Agent, or Firm*—Monica H. Choi

(57) ABSTRACT

A reset signal generator includes an output unit, a trip signal generator, an inverter unit, and a variation reducing unit. The output unit generates a reset signal from a pre-reset signal, and the reset signal follows a supply voltage signal before transitioning to a ground level when the supply voltage signal reaches a tripping voltage. The variation reducing unit is coupled to the inverter unit for reducing a range of the tripping voltage with temperature variations.

18 Claims, 9 Drawing Sheets

RESET SIGNAL GENERATOR IN SEMICONDUCTOR DEVICE

BACKGROUND OF THE INVENTION

This application claims priority under 35 USC §119 to Korean Patent Application No. 2006-01287, filed on Jan. 5, 2006 in the Korean Intellectual Property Office, the disclosure of which is incorporated herein in its entirety by reference.

1. Field of the Invention

The present invention relates generally to generating a reset signal, and more particularly, to generating a reset signal with minimized range of a tripping voltage with temperature variation for stable operation of a semiconductor device.

2. Background of the Invention

Applying a power supply voltage to operate a semiconductor device such as a semiconductor memory device is referred to as "power-up". The semiconductor memory device does not operate immediately at the moment when the power supply voltage is applied. The power supply voltage typically ramps up, and the semiconductor memory device operates after the level of the power supply voltage reaches a predetermined level.

Thus, a semiconductor memory device has a circuit for preventing unstable operation when the logic level is uncertain or preventing latch-up effect during power-up. Typically, a reset signal generating circuit in the semiconductor memory device generates a reset signal used to reset devices of the semiconductor memory device until the power supply voltage is stabilized, and to complete the reset operation when the power supply voltage is stabilized. The reset signal may be called a power-up reset signal, and the reset signal generating circuit may be called a power-up reset circuit.

FIG. 1 is a circuit diagram of a conventional reset signal generating circuit. Referring to FIG. 1, the conventional reset signal generating circuit includes a level sensing unit 10 and a plurality of inverters 12, 14 and 16. The level sensing unit is for sensing a level of a power supply voltage VDD. The inverters 12, 14, and 16 are for buffering a level sense signal output from the level sensing unit 10 and for generating a reset signal VCCHB.

The level sensing unit 10 includes an NMOSFET (N-channel metal oxide semiconductor field effect transistor) NM10. A gate and a drain of the NMOSFET NM10 are coupled together such that the NMOSFET NM10 is diode-connected. The power supply voltage VDD is applied on the gate and the drain of the NMOSFET NM10. A source of the NMOSFET NM10 is coupled to an output node N10. A resistor R10 is coupled between the output node N10 and a ground node.

The inverter 12 includes a PMOSFET (P-channel metal oxide semiconductor field effect transistor) PM12 and an NMOSFET NM12 having gates coupled together at the output node N10. The source of the PMOSFET PM12 has the power supply voltage VDD applied thereon, and the source of the NMOSFET NM12 is coupled to the ground node. The drains of the PMOSFET PM12 and the NMOSFET NM12 are coupled together at a node N12 forming an output of the inverter 12.

The output of the inverter 12 is coupled as an input to the inverter 14. The configuration of the inverters 14 and 16 are similar to that of the inverter 12. The reset signal generated in FIG. 1 may be from one of the inverters 12, 14, and 16. The output of the inverter 14 is an inverted signal of the output of the inverter 12, and thus is represented as VCCH when the reset signal VCCHB is generated as the output of the inverter 16.

Operation of the reset signal generating circuit of FIG. 1 is now described in reference to FIGS. 2A and 2B. The power supply voltage VDD when initially applied increases gradually typically as a ramp. The NMOSFET NM10 is initially turned off when the power supply voltage VDD is less than a threshold voltage of the NMOSFET NM10 such that the output node N10 is initially at a logic low state. Thus, the PMOSFET PM12 is initially turned on such that the node N12 and thus the reset signal VCCHB initially follow the power supply voltage VDD.

FIG. 2A illustrates voltages at nodes of the reset signal generating circuit of FIG. 1 as the power supply voltage VDD ramps up during power-up. Graphs g11 and g12 are for a voltage level VN10 of the output node N10 of the level sensing unit 10 for variable temperatures. A graph g1 is for the reset signal VCCHB, and a graph gT indicates a trip voltage level of the inverter 12.

As the power supply voltage VDD increases, the reset signal VCCHB initially follows the power supply voltage VDD until a trip point P1 when the power supply voltage VDD reaches a tripping voltage. At the trip point P1, the reset signal VCCHB decreases and maintains a ground voltage level.

FIGS. 2A, 2B, and 3 illustrate just the power-up time period when the power supply voltage VDD increases. However, the power supply voltage VDD eventually reaches and maintains a constant final power supply voltage level after the power-up.

FIG. 2B shows a graph g2 of the voltage signal VCCH output by the inverter 14. As the power supply voltage VDD increases, the voltage signal VCCH is initially at the ground level until the trip point P1. After the trip point P1, the voltage signal VCCH increases to follow the power supply voltage VDD.

Referring to the reset signal generating circuit of FIG. 1 and FIGS. 2A and 2B, the power supply voltage VDD increases to reach the threshold voltage of the NMOSFET NM10. At that point, the NMOSFET NM10 operates as a diode, and the resistor R10 determines the current level flowing through the turned on NMOSFET NM10.

The power supply voltage VDD continues to increase until the voltage at the output node N10 reaches a threshold voltage of the NMOSFET NM12. At that point, the voltage at the output node N12 of the inverter 12 is at the ground voltage level. Herein, the voltage that turns on the NMOSFET NM12 may be called a trip voltage, and the reset signal VCCHB decreases and maintains the ground voltage at such a trip voltage (i.e. point P1 in FIG. 2A). At such a point P1, the voltage signal VCCH output from the inverter 14 increases from the ground voltage level to follow the power supply voltage VDD, as shown in FIG. 2B.

For mobile products having low operating voltages, the trip point is desired to be lowered. Further referring to FIGS. 2A and 2B, the trip point may be lowered to P2 from P1 by adjusting characteristics of the level sensing unit 10. In that case, the voltage at the output node N10 of the level sensing unit 10 follows the graph g11 instead of the graph g12. For example, a resistance of the resistor R10 or transistor characteristics of the NMOSFET NM10 may be so adjusted.

However, lowering such a trip point results in reduced margin of the trip voltage as illustrated by the reduced range T1 in FIG. 2A. Nevertheless, the operation of the reset signal generating circuit of FIG. 1 is sensitive to temperature as illustrated in FIG. 3.

FIG. 3 illustrates the reset signal VCCHB at various temperatures. In FIG. 3, a graph g3 in FIG. 3 indicates the reset signal VCCHB at a hot temperature, a graph g4 indicates the reset signal VCCHB at a normal temperature, and a graph g5 designates the reset signal VCCHB at cold temperature. The hot temperature is higher than the normal temperature, and the cold temperature is lower than the normal temperature. For example, the normal temperature is 25° C., the hot temperature is 100° C., and the cold temperature is −25° C. FIG. 3 illustrates the range of the trip point for the various temperatures.

If the reset signal generating circuit of FIG. 1 is designed for normal temperature, the shift in the trip voltage may be outside of the desired operating margin at high or low temperatures. Thus, a reset signal generator with minimized sensitivity to temperature is desired.

SUMMARY OF THE INVENTION

A reset signal generator according to a general aspect of the present invention includes an output unit, a trip signal generator, an inverter unit, and a variation reducing unit. The output unit generates a reset signal from a pre-reset signal, and the reset signal follows a supply voltage signal before transitioning to a predetermined level when the supply voltage signal reaches a tripping voltage. The trip signal generator generates a trip signal from the supply voltage signal. The inverter unit generates the pre-reset signal from the trip signal and the supply voltage signal.

The variation reducing unit is coupled to the inverter unit and is configured to shift the tripping voltage by a variable amount for different temperatures such that a range of the tripping voltage is reduced with temperature variation. For example, the variation reducing unit is configured to shift the tripping voltage by a larger amount for a higher temperature.

The present invention may be used to particular advantage when the reset signal generator is formed within a semiconductor memory device. However, the present invention may be used in other types of semiconductor devices.

In addition, the present invention may be used to particular advantage when the supply voltage signal is generated by a high voltage supply, and when the predetermined level is a ground voltage level.

In this manner, the reset signal has low temperature sensitivity. Thus, even if the tripping voltage of the reset signal is lowered, the tripping voltage would not be decreased beyond the desired operating margin even with temperature variations.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 3, 4, 5, 6, 7, and 8 refer to elements having similar structure and/or function.

DETAILED DESCRIPTION OF THE INVENTION

Figure 4:
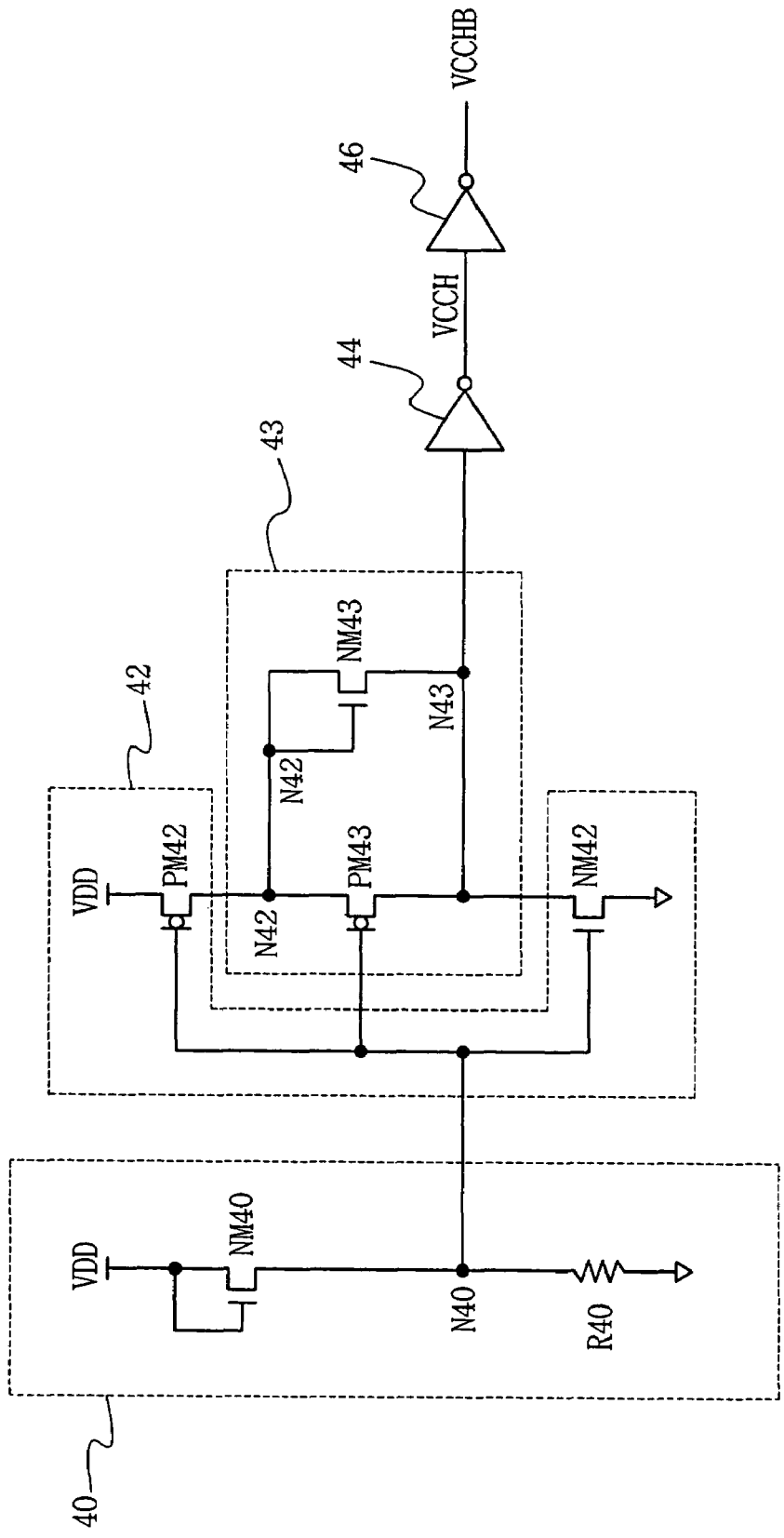
FIG. 4 is a circuit diagram of a reset signal generator, according to an example embodiment of the present invention.

FIG. 4 is a circuit diagram of a reset signal generator according to an example embodiment of the present invention. Such a reset signal generator is formed as an integrated circuit within a semiconductor device such as a semiconductor memory device in one embodiment of the present invention. Referring to FIG. 4, the reset signal generator includes a trip signal generator 40, an inverter unit 42, a variation reducing unit 43, and an output unit 48 comprised of inverters 44 and 46.

The trip signal generator 40 includes a diode-connected NMOSFET (N-channel metal oxide semiconductor field effect transistor) NM40 and a resistor R40. The NMOSFET NM40 has a gate and a drain coupled together with a supply voltage signal VDD applied thereon. The resistor R40 is coupled between a source of the NMOSFET NM40 and a ground node. An output node N40 of the trip signal generator 40 has a trip signal generator thereon.

When the NMOSFET NM40 is turned on to act as a diode, the NMOSFET NM40 and the resistor R40 form a voltage divider with the resistor R40 controlling the current flow through the trip signal generator 40. In that case, the trip signal generated at the node N40 is a divided voltage depending on the supply voltage signal VDD and the resistances of the NMOSFET NM40 and the resistor R40.

The inverter unit 42 includes a first PMOSFET PM42 (P-channel metal oxide semiconductor field effect transistor) and a first NMOSFET NM42. The first PMOSFET PM42 has a source with the supply voltage signal VDD applied thereon. The first NMOSFET NM42 has a source coupled to the ground node, and has a gate coupled to a gate of the first PMOSFET PM42 at the output node N40 of the trip signal generator 40. A pre-reset signal is generated at a drain (i.e., node N43) of the first NMOSFET NM42.

The variation reducing unit 43 includes a second PMOSFET PM43 and a second NMOSFET NM43. The second PMOSFET PM43 has a source coupled to a drain of the first PMOSFET PM42, has a gate coupled to the gates of the first PMOSFET PM42 and the first NMOSFET NM42, and has a drain coupled to the drain of the first NMOSFET NM42. The second NMOSFET NM43 is diode-connected by having a gate and a drain coupled together to the drain of the first PMOSFET PM42, and has a source coupled to the drain of the first NMOSFET NM42.

Figure 8:
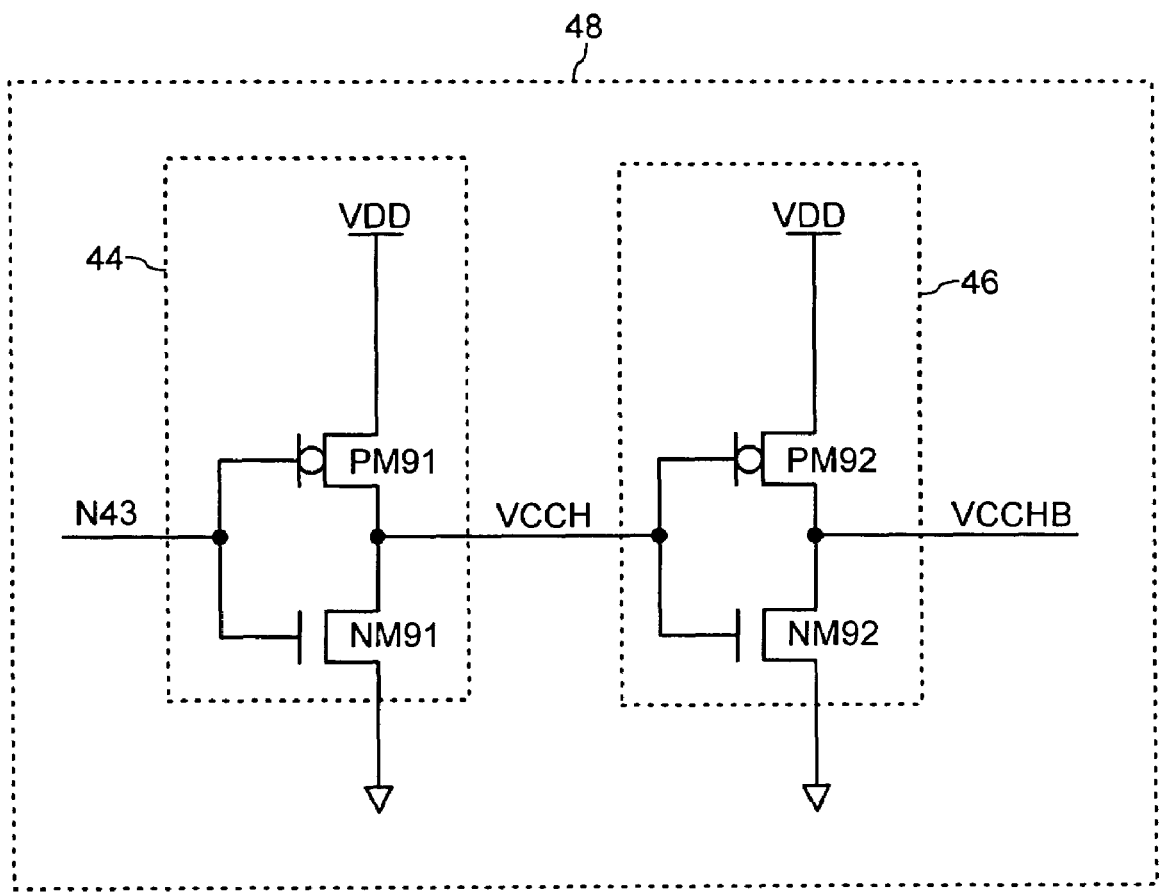
FIG. 8 illustrates an example implementation of an output unit in the reset signal generator of FIG. 4, according to an example embodiment of the present invention.

Referring to FIGS. 4 and 8, the output unit 48 is comprised of the first inverter 44 that inputs the pre-reset signal to generate a subsequent pre-reset signal VCCH. The output unit 48 is also comprised of the second inverter 46 that inputs the subsequent pre-reset signal VCCH to output the reset signal VCCHB.

Referring to FIG. 8, the first inverter 44 includes a third PMOSFET PM91 and a third NMOSFET NM91. The third PMOSFET PM91 has a source with the supply voltage signal VDD applied thereon. The third NMOSFET NM91 has a source coupled to the ground node, has a drain coupled to a drain of the third PMOSFET PM91, and has a gate coupled to a gate of the third PMOSFET PM91. The gates of the third PMOSFET PM91 and the third NMOSFET NM91 have the pre-reset signal from the inverter unit 42 applied thereon. The drains of the third PMOSFET PM91 and the third NMOSFET NM91 generate the subsequent pre-reset signal VCCH.

Further referring to FIG. 8, the second inverter 46 includes a fourth PMOSFET PM92 and a fourth NMOSFET NM92. The fourth PMOSFET PM92 has a source with the supply voltage signal VDD applied thereon. The fourth NMOSFET NM92 has a source coupled to the ground node, has a drain coupled to a drain of the fourth PMOSFET PM92, and has a gate coupled to a gate of the fourth PMOSFET PM92. The gates of the fourth PMOSFET PM92 and the fourth NMOSFET NM92 have the subsequent pre-reset signal VCCH applied thereon. The drains of the fourth PMOSFET PM92 and the fourth NMOSFET NM92 generate the reset signal VCCHB.

Figure 5:
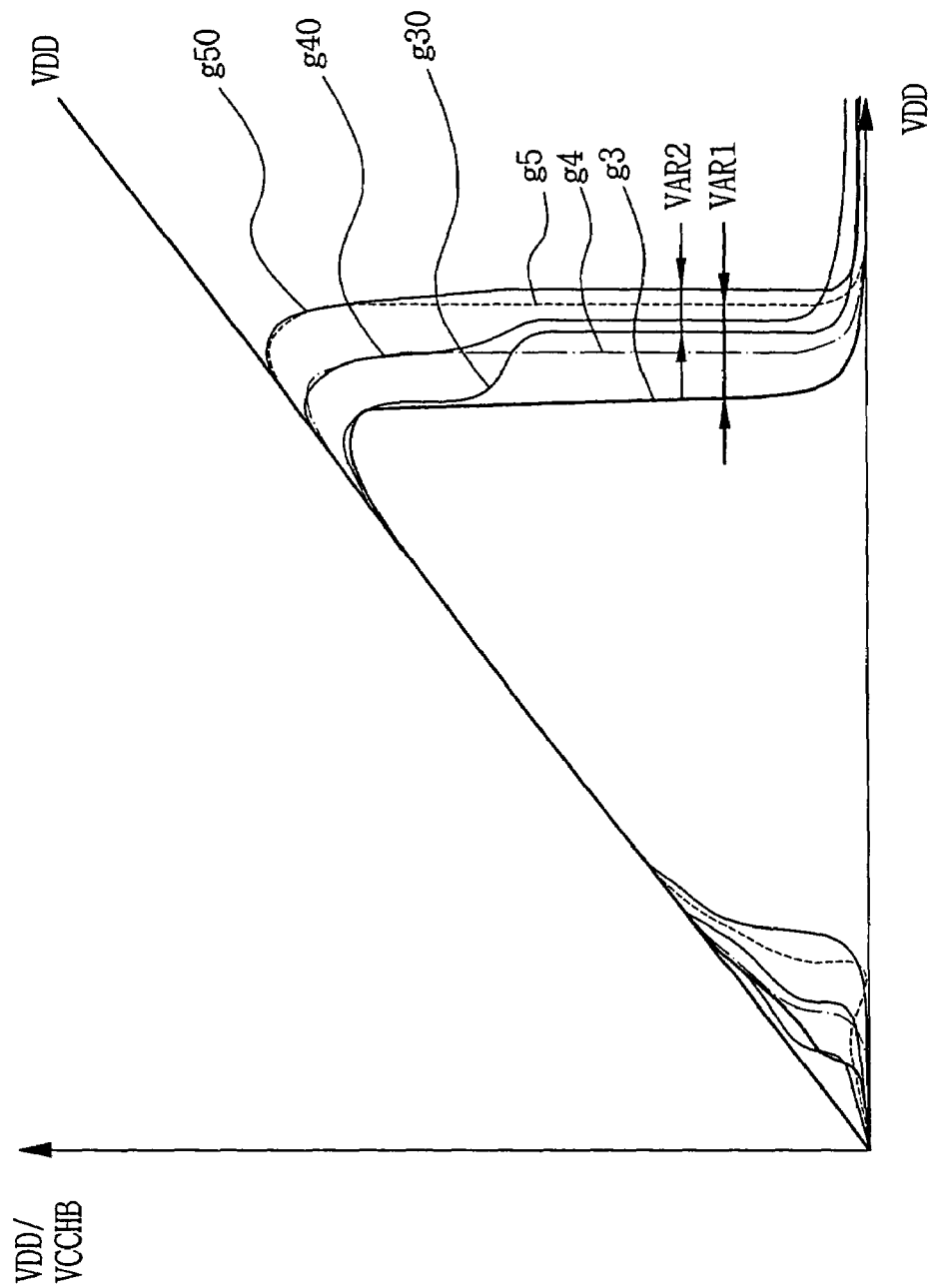
FIG. 5 illustrates variation of a generated reset signal with temperature for the reset signal generator of FIG. 4, according to an example embodiment of the present invention.

FIG. 5 illustrates reset signals VCCHB generated from the reset signal generator of FIG. 4 at various temperatures, according to an example embodiment of the present invention. FIG. 5 also illustrates the ramping up of the power supply voltage signal VDD at power-up of a semiconductor device such as a semiconductor memory device. The operation of the reset signal generator of FIG. 4 is now explained in reference to FIG. 5.

In one embodiment of the present invention, the power supply voltage signal VDD is generated from a high voltage supply with the VDD signal eventually reaching a steady state voltage that is of higher potential than the ground node. However, FIG. 5 illustrates the power-up operation when the VDD signal ramps up before reaching such a steady state voltage.

Initially, when the power supply voltage signal VDD is less than a threshold voltage of the diode-connected NMOSFET NM40 in the trip signal generator 40, the NMOSFET NM40 is initially turned off such that the output node N40 is initially at a logic low state. Thus, the PMOSFET PM42 is initially turned on such that the node N42 initially follows the power supply voltage signal VDD.

As the power supply voltage signal VDD is further increased to and beyond the threshold voltage of diode-connected NMOSFET NM40, the NMOSFET NM40 turns on. As a result, the trip signal generator generates a trip voltage at the output node N40. The resistance of the NMOSFET NM40 and the resistance of the resistor R40 act as a resistive voltage divider at the output node N40 for the power supply voltage signal VDD.

In FIG. 5, the voltage level of the VDD signal when the reset signal VCCHB makes the transition to the ground voltage is referred to as a tripping voltage. The voltage at node N43 input by the inverter 44 of the output unit 48 is decreased by the gate-to-source voltage Vgs of the second NMOSFET NM43 when turned on. Thus, the inverters 44 and 46 of the output unit 48 are toggled with the tripping voltage being shifted to a higher level than if the variation reducing unit 43 were not included.

Figure 1:
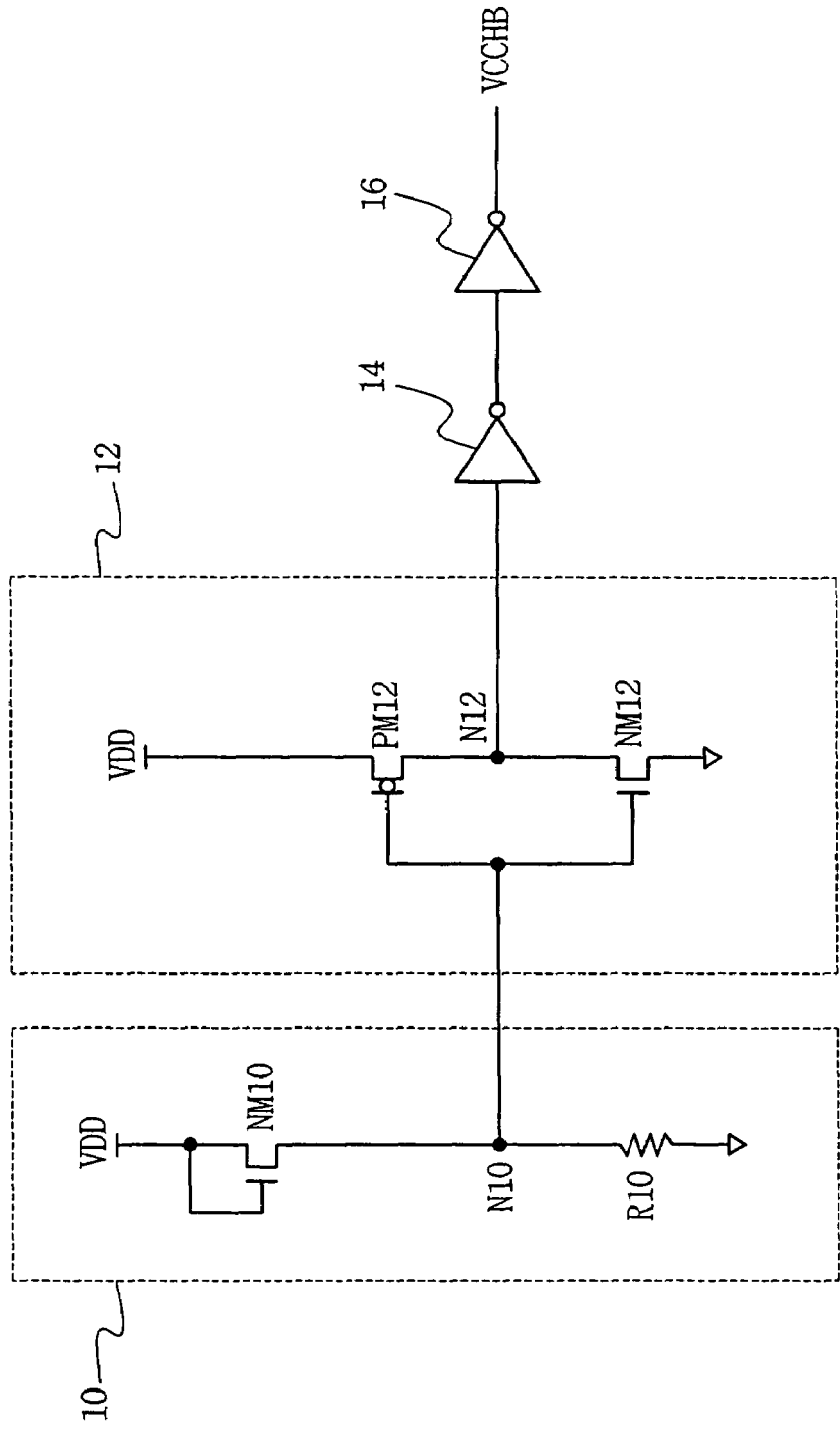
FIG. 1 is a circuit diagram of a conventional reset signal generating circuit.
Figure 2A:
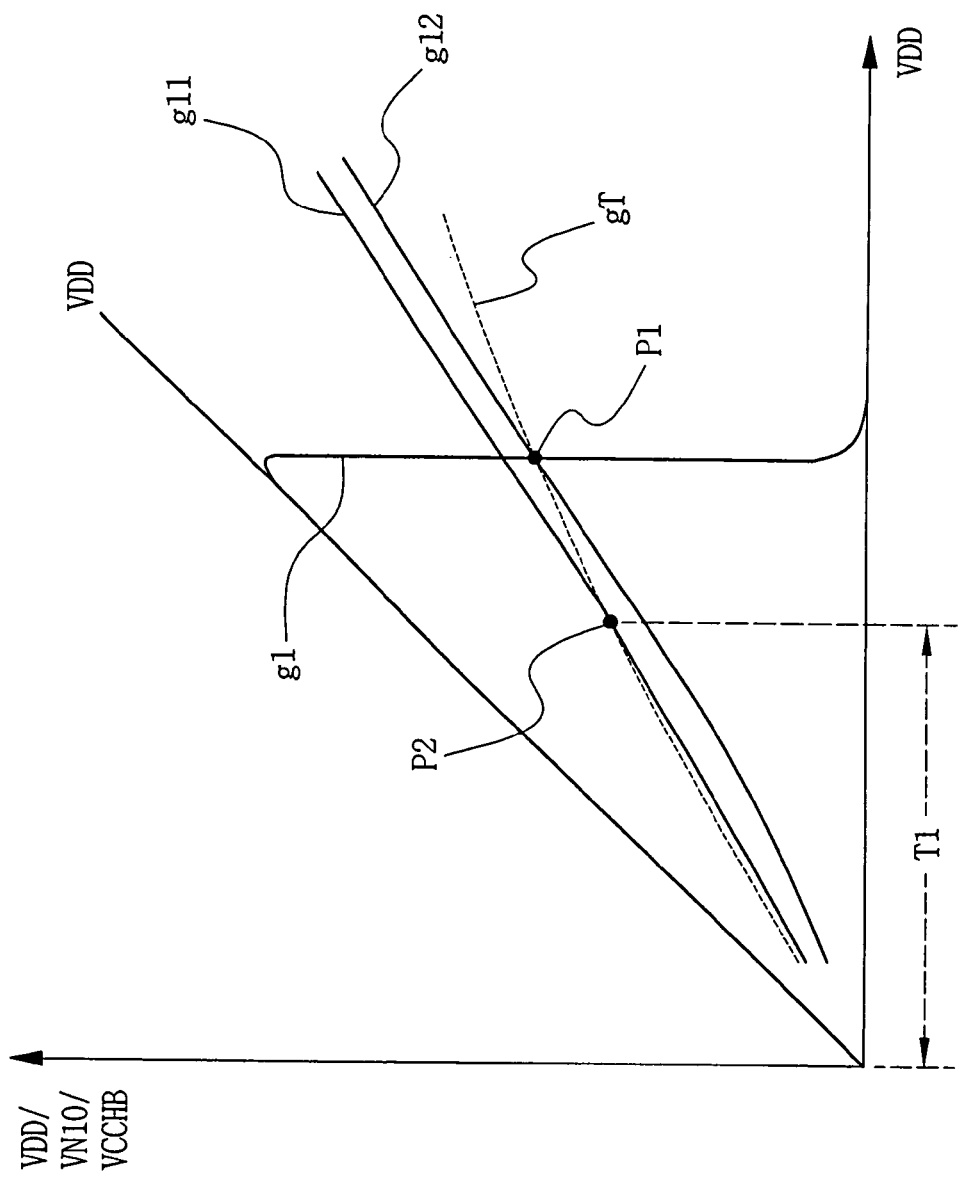
FIGS. 2A and 2B illustrate graphs of voltages including a generated reset signal during operation of the reset signal generating circuit of FIG. 1.
Figure 2B:
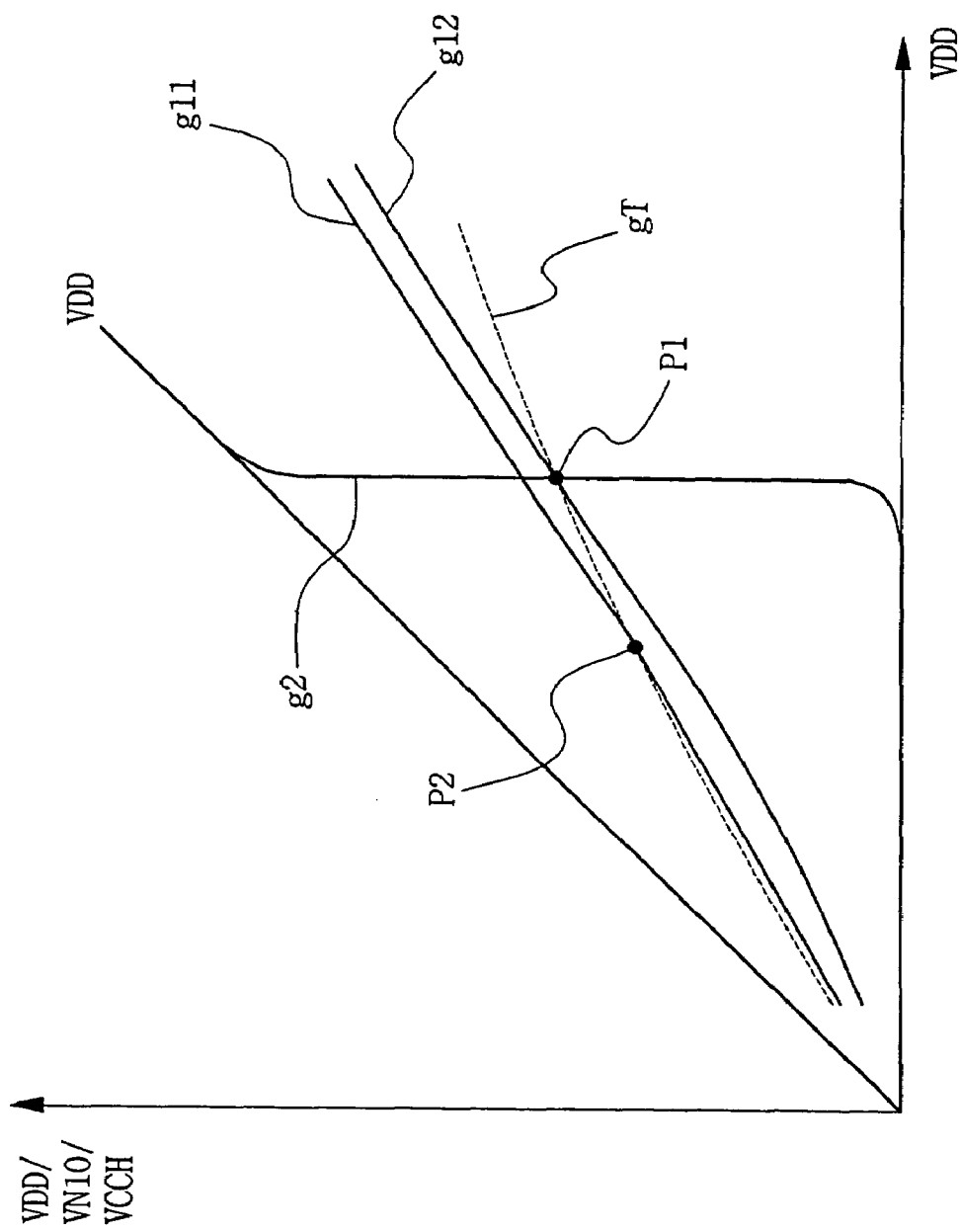
Figure 3:
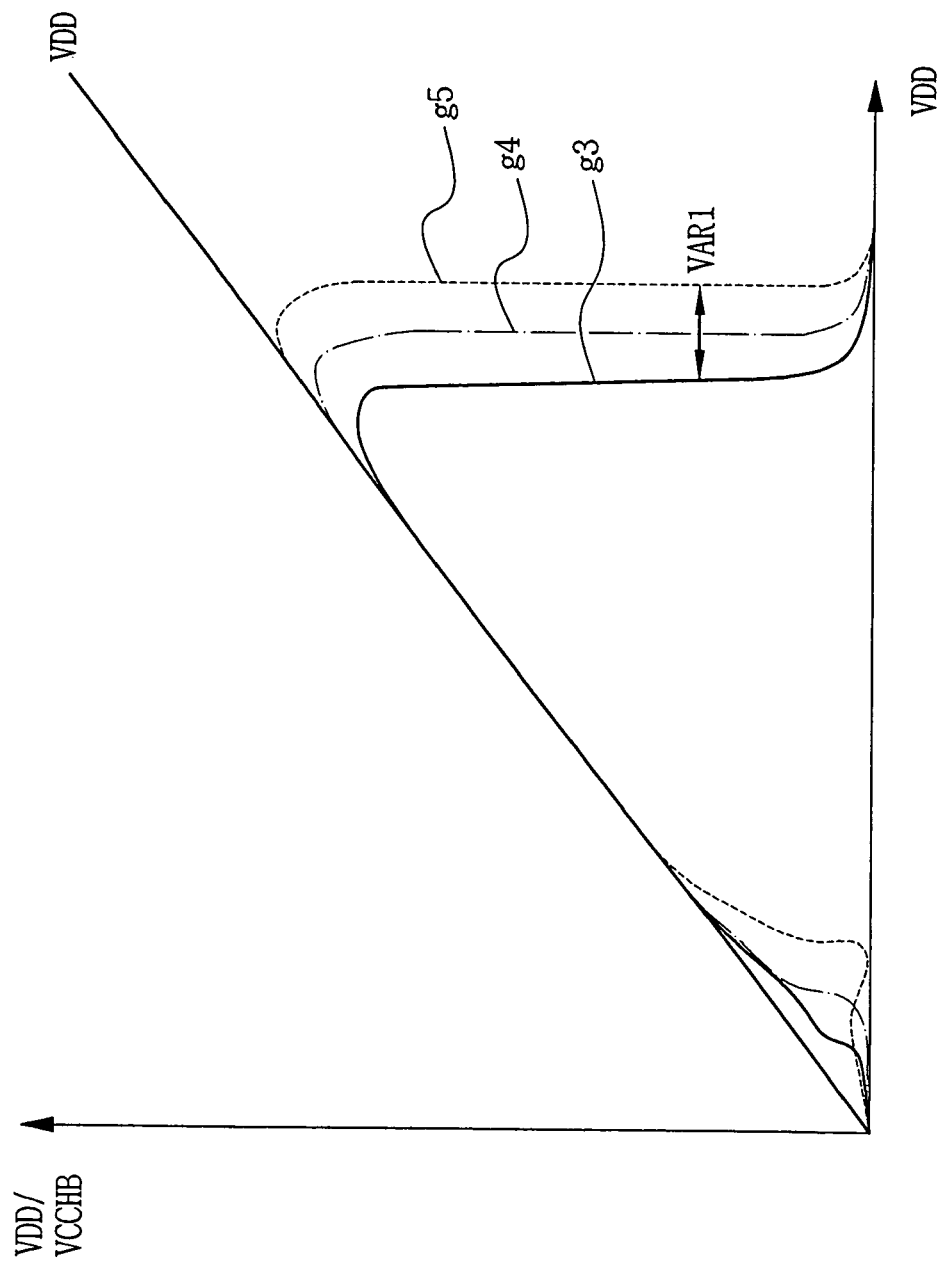
FIG. 3 illustrates variation of the reset signal with temperature, according to the prior art.

FIG. 5 illustrates (in dashed lines) the graphs g3, g4, and g5 of the reset signal as described in reference to FIG. 3 and as generated by the reset signal generating circuit in FIG. 1 of the prior art. The reset signal has a range of VAR1 with temperature variation.

FIG. 5 shows graphs g30, g40, and g50 of the reset signal VCCHB generated by the reset signal generator of FIG. 4. The graph g30 indicates the reset signal VCCHB at a hot temperature, the graph g40 indicates the reset signal VCCHB at a normal temperature, and the graph g50 designates the reset signal VCCHB at cold temperature. The hot temperature is higher than the normal temperature, and the cold temperature is lower than the normal temperature. For example, the normal temperature is 25° C., the hot temperature is 100° C., and the cold temperature is -25° C.

The gate-to-source voltage of the NMOSFET NM43 of the variation reducing unit 43 also varies with temperature. The gate-to-source voltage of the NMOSFET NM43 is highest at the hot temperature and is lowest at the low temperature. Thus, the amount of shifting of the tripping voltage to the right in FIG. 5 for the graph g30 is highest, and the amount of shifting of the tripping voltage to the right in FIG. 5 for the graph g50 is lowest. With such variable amount of shifting with temperature variation, the reset signal VCCHB generated by the reset signal generator of FIG. 4 has a reduced range VAR2 with temperature variation.

The NMOSFET NM42 has a lower threshold value with higher temperature such that the reset signal generator would have a lower tripping voltage with higher temperature without the variation reducing unit 43 (as illustrated by the graphs g3, g4, and g5). Thus, the range VAR1 of the reset signal VCCHB with temperature variation without the variation reducing unit 43 in the prior art is higher than the range VAR2 of the reset signal VAR2 for the present invention.

Note that the subsequent pre-reset signal VCCH as output by the inverter 44 may also be used as the reset signal of the reset signal generator of FIG. 4. In that case, the subsequent pre-reset signal VCCH maintains the ground level and then follows the power supply voltage signal VDD at the tripping voltage.

Figure 6:
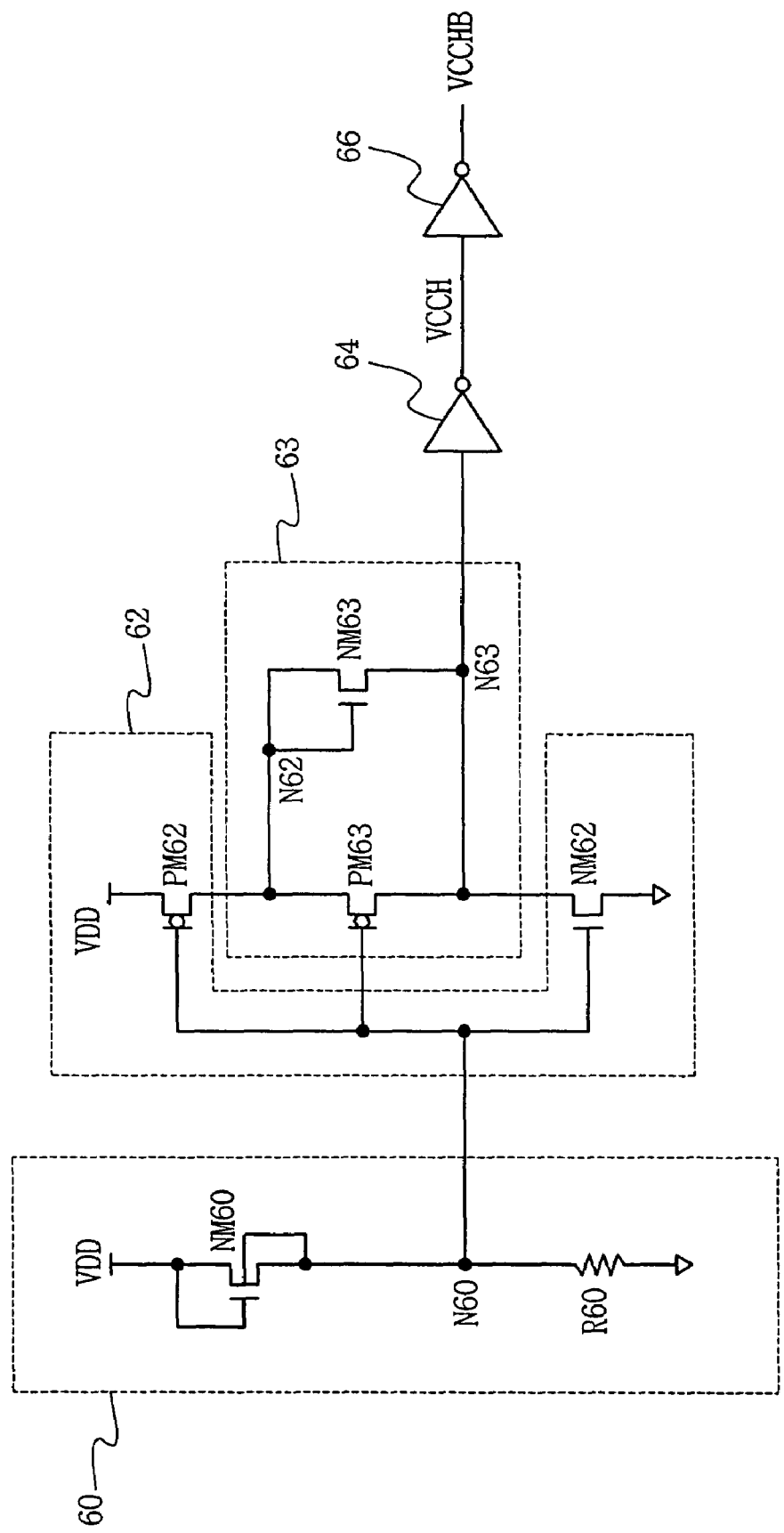
FIG. 6 is a circuit diagram of a reset signal generator, according to another example embodiment of the present invention.

FIG. 6 is a circuit diagram of a reset signal generator, according to another example embodiment of the present invention. The reset signal generator of FIG. 6 is substantially similar to the reset signal generator of FIG. 4.

Thus, the reset signal generator of FIG. 6 includes a trip signal generator 60, an inverter unit 62, a variation reducing unit 63, and an output unit comprised of inverters 64 and 66, similar to the components 40, 42, 43, 44, and 46, respectively, of FIG. 4. The trip signal generator 60 has an NMOSFET NM60 and a resistor R60 similarly configured as the components NM40 and R40 of FIG. 4.

The inverter unit 62 has a PMOSFET PM62 and an NMOSFET NM62 similarly configured as the components PM42 and NM42 of FIG. 4. The variation reducing unit 63 has a PMOSFET PM63 and an NMOSFET NM63 similarly configured as the components PM43 and NM43 of FIG. 4.

However, the NMOSFET NM60 of FIG. 6 has a substrate that is connected to a source of the NMOSFET NM60 for reducing an undesired body effect. The body effect in a field effect transistor is in general and individually known to one of ordinary skill in the art. The body effect in a field effect transistor refers to threshold voltage variation from a voltage difference between the source and the substrate of the field effect transistor.

Figure 7:
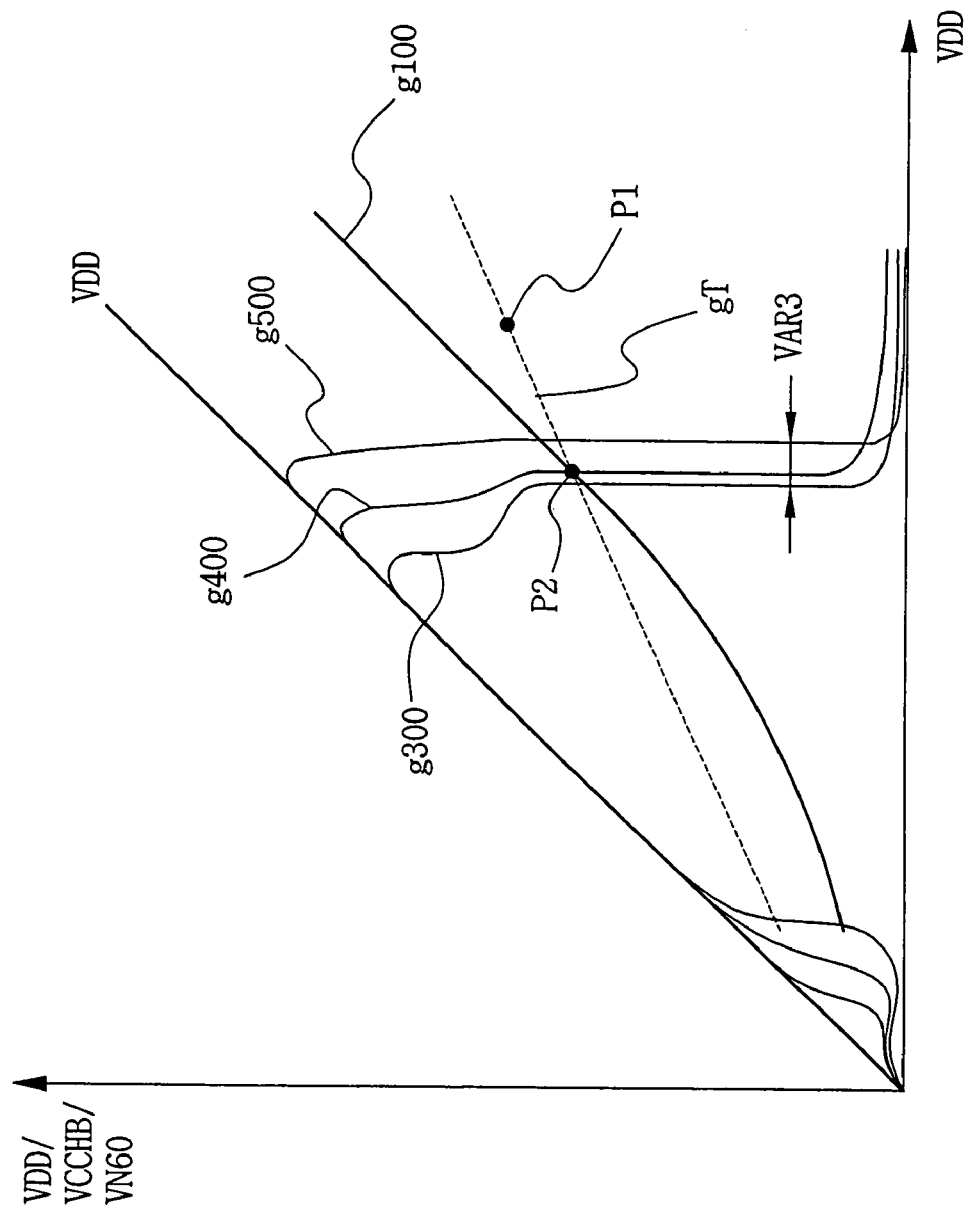
FIG. 7 illustrates variation of a generated reset signal with temperature for the reset signal generator of FIG. 6, according to an example embodiment of the present invention.

By connecting the substrate to the source for the NMOSFET NM60, the range of tripping voltage with temperature variation may further be minimized in the embodiment of FIG. 6. FIG. 7 illustrates the reset signal VCCHB versus the power supply voltage signal VDD generated by the reset signal generator of FIG. 6 at high temperature (i.e. graph g300), at normal temperature (i.e. graph g400), and at low temperature (i.e. graph g500).

A range VAR3 of the reset signal VCCHB with temperature variation is reduced for the reset signal generator of FIG. 6 from the prior art range VAR1. A graph g100 in FIG. 7 illustrates a voltage level at the output node N60 of the trip signal generator 60, and a graph gT indicates a trip voltage level of the inverter unit 62.

In this manner, by reducing the range of the reset signal VCCHB with temperature, the tripping voltage may be further reduced to tripping point P2 from the higher tripping point P1 as illustrated in FIG. 7. Such lower tripping voltage is advantageous for operating mobile devices at lower supply voltage for reduced power consumption.

The foregoing is by way of example only and is not intended to be limiting. For example, any number values or number or types of transistor devices illustrated herein are by way of example only. In addition, the signals shown in the voltage waveforms of FIGS. 5 and 7 are by way of example only for describing example operations.

The present invention is limited only as defined in the following claims and equivalents thereof.

What is claimed is:

1. A reset signal generator comprising:
an output unit for generating a reset signal from a pre-reset signal, wherein the reset signal follows a supply voltage signal before transitioning to a predetermined level when the supply voltage signal reaches a tripping voltage;
a trip signal generator for generating a trip signal from the supply voltage signal;
an inverter unit for generating the pre-reset signal from the trip signal and the supply voltage signal; and
a variation reducing unit coupled to the inverter unit and configured to shift the tripping voltage by a variable amount for different temperatures such that a range of the tripping voltage is reduced with temperature variation,
wherein the inverter unit includes a first field effect transistor, and wherein the variation reducing unit includes a second field effect transistor,
and wherein the first and second field effect transistors are connected in series between a voltage supply generating the supply voltage signal and an input to the output unit,
and wherein the first and second field effect transistors have respective channels of opposite conductivity type,
and wherein a gate to source path of the second field effect transistor is connected directly in series with a drain to source path of the first field effect transistor between the voltage supply and the input to the output unit without an intervening device between the gate to source path of the second field effect transistor and the drain to source path of the first field effect transistor;
and wherein respective drain to source paths of no more than two field effect transistors of the inverter unit and no more than one field effect transistor of the variation reducing unit are connected in series between the voltage supply and a ground node such that the respective drain to source paths of a total of no more than three field effect transistor are connected in series between the voltage supply and the ground node.

2. The reset signal generator of claim 1, wherein the second field effect transistor is diode-connected in parallel across the respective drain to source path of a middle one of said series-connected field effect transistors.

3. A reset signal generator comprising:
means for generating a reset signal that follows a supply voltage signal before transitioning to a predetermined level when the supply voltage signal reaches a tripping voltage; and
means for shifting the tripping voltage by a variable amount for different temperatures such that a range of the tripping voltage is reduced with temperature variation;
wherein the means for generating includes an inverter unit with a first field effect transistor, and wherein the means for shifting includes a variation reducing unit with a second field effect transistor,
and wherein the first and second field effect transistors are connected in series between a voltage supply generating the supply voltage signal and an input to an output unit outputting the reset signal,
and wherein the first and second field effect transistors have respective channels of opposite conductivity type,
and wherein a gate to source path of the second field effect transistor is connected directly in series with a drain to source path of the first field effect transistor between the voltage supply and the input to the output unit without an intervening device between the gate to source path of the second field effect transistor and the drain to source path of the first field effect transistor;
and wherein respective drain to source paths of no more than two field effect transistors of the inverter unit and no more than one field effect transistor of the variation reducing unit are connected in series between the voltage supply and a ground node such that the respective drain to source paths of a total of no more than three field effect transistor are connected in series between the voltage supply and the ground node.

4. The reset signal generator of claim 3, wherein the second field effect transistor is diode-connected in parallel across the respective drain to source path of a middle one of said three series-connected field effect transistors.

5. The reset signal generator of claim 1, wherein the variation reducing unit is configured to shift the tripping voltage by a larger amount for a higher temperature.

6. The reset signal generator of claim 1, wherein the inverter unit includes:
a first PMOSFET (P-channel metal oxide semiconductor field effect transistor) that is the first field effect transistor having a source with the supply voltage signal applied thereon, and having a drain coupled to the variation reducing unit; and
a first NMOSFET (N-channel metal oxide semiconductor field effect transistor) having a source coupled to a ground node, having a drain coupled to the variation reducing unit, and having a gate coupled to a gate of the first PMOSFET,
wherein the pre-reset signal is generated at the drain of the first NMOSFET.

7. The reset signal generator of claim 6, wherein the variation reducing unit includes:
a second PMOSFET having a source coupled to the drain of the first PMOSFET, having a gate coupled to the gates of the first PMOSFET and the first NMOSFET, and having a drain coupled to the drain of the first NMOSFET; and
a second NMOSFET that is the second field effect transistor having a gate and a drain coupled to the drain of the first PMOSFET, and having a source coupled to the drain of the first NMOSFET.

8. The reset signal generator of claim 7, wherein the amount of shifting of the tripping voltage is dependent on a gate-to-source of the second NMOSFET.

9. The reset signal generator of claim 7, wherein the output unit includes:
 a first inverter for inputting the pre-reset signal to generate a subsequent pre-reset signal; and
 a second inverter for inputting the subsequent pre-reset signal to generate the reset signal.

10. The reset signal generator of claim 9, wherein the first inverter includes:
 a third PMOSFET having a source with the supply voltage signal applied thereon; and
 a third NMOSFET having a source coupled to the ground node, having a drain coupled to a drain of the third PMOSFET, and having a gate coupled to a gate of the third PMOSFET,
 wherein the gates of the third PMOSFET and the third NMOSFET have the pre-reset signal applied thereon, and wherein the drains of the third PMOSFET and the third NMOSFET generate the subsequent pre-reset signal.

11. The reset signal generator of claim 10, wherein the second inverter includes:
 a fourth PMOSFET having a source with the supply voltage signal applied thereon; and
 a fourth NMOSFET having a source coupled to the ground node, having a drain coupled to a drain of the fourth PMOSFET, and having a gate coupled to a gate of the fourth PMOSFET,
 wherein the gates of the fourth PMOSFET and the fourth NMOSFET have the subsequent pre-reset signal applied thereon, and wherein the drains of the fourth PMOSFET and the fourth NMOSFET generate the reset signal.

12. The reset signal generator of claim 6, wherein the trip signal generator includes:
 another NMOSFET having a gate and a drain coupled together with the supply voltage signal applied thereon; and
 a resistor coupled to the ground node, and coupled to a drain of the other NMOSFET at a node generating the trip signal and coupled to the gates of the first PMOSFET and the first NMOSFET.

13. The reset signal generator of claim 12, wherein the other NMOSFET has a substrate coupled to the source of the other NMOSFET.

14. The reset signal generator of claim 1, wherein the reset signal generator is formed within a semiconductor memory device.

15. The reset signal generator of claim 1, wherein the supply voltage signal is generated by a high voltage supply, and wherein the predetermined level is a ground voltage level.

16. The reset signal generator of claim 3, further comprising:
 means for shifting the tripping voltage by a larger amount for a higher temperature.

17. The reset signal generator of claim 3, wherein the reset signal generator is formed within a semiconductor memory device.

18. The reset signal generator of claim 3, wherein the supply voltage signal is generated by a high voltage supply, and wherein the predetermined level is a ground voltage level.

* * * * *